(12) United States Patent
Zafrany

(10) Patent No.: US 11,139,779 B2
(45) Date of Patent: Oct. 5, 2021

(54) DUAL BAND MIXER

(71) Applicant: Samsung Electronics Co., Ltd., Suwon-si (KR)

(72) Inventor: Arik Zafrany, San Jose, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/704,968

(22) Filed: Dec. 5, 2019

(65) Prior Publication Data

US 2021/0119580 A1    Apr. 22, 2021

Related U.S. Application Data

(60) Provisional application No. 62/923,917, filed on Oct. 21, 2019.

(51) Int. Cl.
*H03D 7/14* (2006.01)
*H04B 1/00* (2006.01)
*H04B 1/401* (2015.01)

(52) U.S. Cl.
CPC ........... *H03D 7/1441* (2013.01); *H04B 1/006* (2013.01); *H04B 1/401* (2013.01)

(58) Field of Classification Search
None
See application file for complete search history.

(56) References Cited

U.S. PATENT DOCUMENTS

| | | |
|---|---|---|
| 2,601,467 A | 6/1952 | Torre |
| 6,134,452 A | 10/2000 | Hufford et al. |
| 6,348,830 B1 * | 2/2002 | Rebeiz .................. H03D 7/1425 327/355 |
| 6,665,528 B2 | 12/2003 | McNamara et al. |
| 6,959,178 B2 | 10/2005 | Macedo et al. |
| 7,372,352 B2 | 5/2008 | Lee et al. |
| 7,415,257 B2 | 8/2008 | Chou et al. |
| 7,456,722 B1 | 11/2008 | Eaton et al. |

(Continued)

FOREIGN PATENT DOCUMENTS

| | | |
|---|---|---|
| CN | 102130654 A | 7/2011 |
| CN | 105897299 A | 8/2016 |

(Continued)

OTHER PUBLICATIONS

Ruey-Lue Wang et al., "A Concurrent Dual-Band Mixer with On-Wafer Balun for Multi-Standard Applications", 4 pgs, Nov. 30, 2008, Taiwan.

(Continued)

*Primary Examiner* — Lincoln D Donovan
*Assistant Examiner* — Khareem E Almo
(74) *Attorney, Agent, or Firm* — Lewis Roca Rothgerber Christie LLP

(57) ABSTRACT

A dual-band mixer circuit includes a mixer configured to receive an input signal and a local oscillator (LO) signal and to generate an output frequency signal, and a switchable inductance circuit coupled to an output of the mixer, and including a transformer including a primary inductor and a secondary inductor, the primary inductor being electrically coupled to the output of the mixer, a capacitor electrically coupled to the secondary inductor, and a switch electrically coupled to the capacitor and the secondary inductor.

17 Claims, 3 Drawing Sheets

(56) References Cited

U.S. PATENT DOCUMENTS

| | | | |
|---|---|---|---|
| 8,064,867 B2 | 11/2011 | Li et al. | |
| 8,219,060 B2 | 7/2012 | Bhagat et al. | |
| 8,494,474 B1 | 7/2013 | Brewer et al. | |
| 8,498,604 B2* | 7/2013 | Jiang | H03D 7/1441 455/326 |
| 8,558,605 B1 | 10/2013 | Wang et al. | |
| 9,263,990 B2* | 2/2016 | Goldblatt | H03D 7/1491 |
| 9,374,139 B2* | 6/2016 | Sugar | H04B 1/005 |
| 10,177,722 B2* | 1/2019 | Wang | H03F 1/565 |
| 10,383,990 B2* | 8/2019 | Petersen | H02J 50/10 |
| 10,516,404 B2* | 12/2019 | Lee | H03B 5/1265 |
| 2002/0163375 A1* | 11/2002 | Wu | H03D 7/1441 327/356 |
| 2010/0123536 A1 | 5/2010 | Lu et al. | |

FOREIGN PATENT DOCUMENTS

| | | |
|---|---|---|
| CN | 108627836 B1 | 10/2018 |
| CN | 109714005 A | 5/2019 |
| EP | 1304795 B1 | 6/2006 |
| KR | 20060083556 A | 7/2006 |
| TW | 200713797 A | 4/2007 |

OTHER PUBLICATIONS

Ruey-Lue Wang et al., "A Concurrent Dual-Band Folded-Cascode Mixer Uusing a LC-Tank Biasing Circuit", Microelectronics Journal 43, pp. 1010-1015, 2012.

Brad R. Jackson et al., "A Dual-Band Self-Oscillating Mixer for C-Band and X-Band Applications", IEEE Transactions on Microwave Theory and Techniques, vol. 58, No. 2, Feb. 2020, pp. 318-323.

Miguel A. Martins et al., Muti-Band Combined LNA and Mixer, IEEE, 2008, pp. 920-923.

Zixuan Ning et al., "A Novel Dual-Band Mixer Using Arbitrary Impedances-Matching Coupler for Long-Term Evolution Applications", Taylor & Francis, LLC, Electromagnetics 35, 2015, pp. 205-215.

Tamer A. Abdelrheem et al., "A Concurrent Dual-Band Mixer for 900-MHz/1.8GHz RF Front-Ends", IEEE, 2004, pp. 1291-1294.

Wei Fei et al., "Design and Analysis of Wide Frequency-Tuning Range CMOS 60 GHz VCO by Switching Inductor Loaded Transformer", IEEE Transaction on Circuits and Systems—I:Regular Papers, vol. 61, No. 3, Mar. 2014, pp. 699-711.

Xiaolong Liu et al., "Magnetic-Tuning Millimeter-Wave CMOS Oscillators", IEEE, 2018, pp. 1-8.

* cited by examiner

DUAL BAND MIXER

CROSS-REFERENCE TO RELATED APPLICATION(S)

This application claims priority to, and the benefit of, U.S. Provisional Application No. 62/923,917 ("SYSTEM AND METHOD FOR PROVIDING DUAL BAND MIXER USING SWITCHABLE INDUCTOR"), filed on Oct. 21, 2019, the entire content of which is incorporated herein by reference.

FIELD

Aspects of embodiments of the present disclosure are generally related to a mixer circuit and an electronic system including the same.

BACKGROUND

A mixer or a frequency mixer is an electrical circuit that generates frequencies based on two frequency signals applied to the mixer. For example, a mixer may generate signals at the sum and difference of the original frequencies. A mixer may be part of a radio frequency (RF) signal path used to convert an intermediate frequency (IF) to an RF by multiplying the IF with a local oscillator (LO) frequency to generate the RF.

However, current mixers for generating two center frequencies for a dual frequency band operation mode on a transmitter (as, e.g., would be the case for 5G (fifth generation) transmission) often suffer from nonlinearity and low gain.

The above information disclosed in this Background section is only for enhancement of understanding of the present disclosure, and therefore it may contain information that does not form the prior art that is already known to a person of ordinary skill in the art.

SUMMARY

Aspects of the present disclosure are directed to a dual-band mixer using a switchable inductor and a transmitter utilizing the dual band mixer to operate in two different frequency bands.

According to some embodiments of the present disclosure, there is provided a dual-band mixer circuit including: a mixer configured to receive an input signal and a local oscillator (LO) signal and to generate an output frequency signal; and a switchable inductance circuit coupled to an output of the mixer, and including: a transformer including a primary inductor and a secondary inductor, the primary inductor being electrically coupled to the output of the mixer; a capacitor electrically coupled to the secondary inductor; and a switch electrically coupled to the capacitor and the secondary inductor.

In some embodiments, the capacitor is electrically coupled in parallel with the secondary inductor of the transformer, and the switch is electrically coupled in parallel with the secondary inductor of the transformer.

In some embodiments, the mixer is configured to generate the output frequency signal within a first frequency band or a second frequency band, and the first frequency band does not overlap with the second frequency band.

In some embodiments, the input signal is an intermediate frequency signal, and the output frequency signal is a radio frequency signal.

In some embodiments, the input signal is a radio frequency signal, and the output frequency signal is an intermediate frequency signal.

In some embodiments, the mixer is configured to generate the output frequency signal within a first frequency band or a second frequency band, the switch is configured to activate or deactivate based on a control signal, and the mixer is configured to generate the output frequency signal at the second frequency band in response to the switch being activated, and to generate the output frequency signal at the first frequency band in response to the switch being deactivated.

In some embodiments, the first and second frequency bands are centered at 28 GHz and 39 GHz, respectively.

In some embodiments, the mixer is configured to generate the output frequency signal within a first frequency band or a second frequency band, the primary inductor and the secondary inductor include first turns and second turns, the first and second turns being mutually concentric, and the primary and secondary inductors are stacked in parallel at different physical layers.

In some embodiments, a center of the first frequency band is based on a first distance between adjacent ones of the first turns, a second distance between innermost turn of the second turns and an outermost turn of the first turns, a third distance between adjacent ones of the second turns, a capacitance value of the capacitor, and a frequency separation between the first and second frequency bands is based on the second and third distances.

In some embodiments, the transformer is a 1:1 transformer, the capacitor is a metal-oxide-metal (MOM) capacitor, and the switch is a metal-oxide-semiconductor field effect transistor (MOSFET).

In some embodiments, the mixer is a gilbert cell mixer.

According to some embodiments of the present disclosure, there is provided a transceiver including: a frequency band selector configured to generate a control signal; a mixer configured to receive an input signal and a local oscillator (LO) signal and to generate an output frequency signal; and a switchable inductance circuit electrically coupled to an output of the mixer, and including: a transformer including a primary inductor and a secondary inductor, the primary inductor being electrically coupled to the output of the mixer; a capacitor electrically coupled to the secondary inductor; and a switch electrically coupled to the capacitor and the secondary inductor and configured to activate or deactivate based on the control signal.

In some embodiments, the transceiver further includes a local oscillator configured to generate the LO signal at an LO frequency.

In some embodiments, the mixer is configured to generate the output frequency signal within a first frequency band or a second frequency band, and the first frequency band does not overlap with the second frequency band.

In some embodiments, the mixer is configured to generate the output frequency signal within a first frequency band or a second frequency band, the switch is configured to activate or deactivate based on a control signal, and the mixer is configured to generate the output frequency signal at the second frequency band in response to the switch being activated, and to generate the output frequency signal at the first frequency band in response to the switch being deactivated.

In some embodiments, the first and second frequency band are centered at 28 GHz and 39 GHz, respectively.

In some embodiments, the input signal is an intermediate frequency signal, and the output frequency signal is a radio frequency signal.

In some embodiments, the capacitor is electrically coupled in parallel with the secondary inductor of the transformer, and the switch is electrically coupled in parallel with the secondary inductor of the transformer.

According to some embodiments of the present disclosure, there is provided a method of operating a dual-band mixer circuit including: activating, by a frequency band selector, a switch of the dual-band mixer circuit to operate at a first frequency band; and deactivating, by the frequency band selector, the switch of the dual-band mixer circuit to operate at a second frequency band, the dual-band mixer circuit including: a mixer configured to receive an input signal and a local oscillator (LO) signal and to generate an output frequency signal within the first frequency band or the second frequency band; and a switchable inductance circuit electrically coupled to an output of the mixer, and including: a transformer including a primary inductor and a secondary inductor, the primary inductor being electrically coupled to the output of the mixer; a capacitor electrically coupled to the secondary inductor; and the switch that is electrically coupled to the capacitor and the secondary inductor and configured to activate or deactivate based on a control signal from the frequency band selector.

BRIEF DESCRIPTION OF THE DRAWINGS

The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims. The accompanying drawings, together with the specification, illustrate example embodiments of the present disclosure, and, together with the description, serve to explain the principles of the present disclosure.

DETAILED DESCRIPTION

The detailed description set forth below is intended as a description of example embodiments of a system and method for utilizing a dual-band mixer, provided in accordance with the present disclosure, and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

The present disclosure is generally directed to a system and method for utilizing a switchable inductance circuit in a dual-band mixer circuit to achieve dual frequency band operation with greater linearity and higher gain that could be achieved using a conventional mixer. A primary loop of a transformer in the switchable inductance circuit is electrically connected to a mixer, and a secondary loop of the transformer is electrically connected to a capacitor and a switch in parallel. Activating/deactivating the switch tunes the dual-band mixer circuit to switch between a lower center frequency and a higher center frequency.

Figure 1:
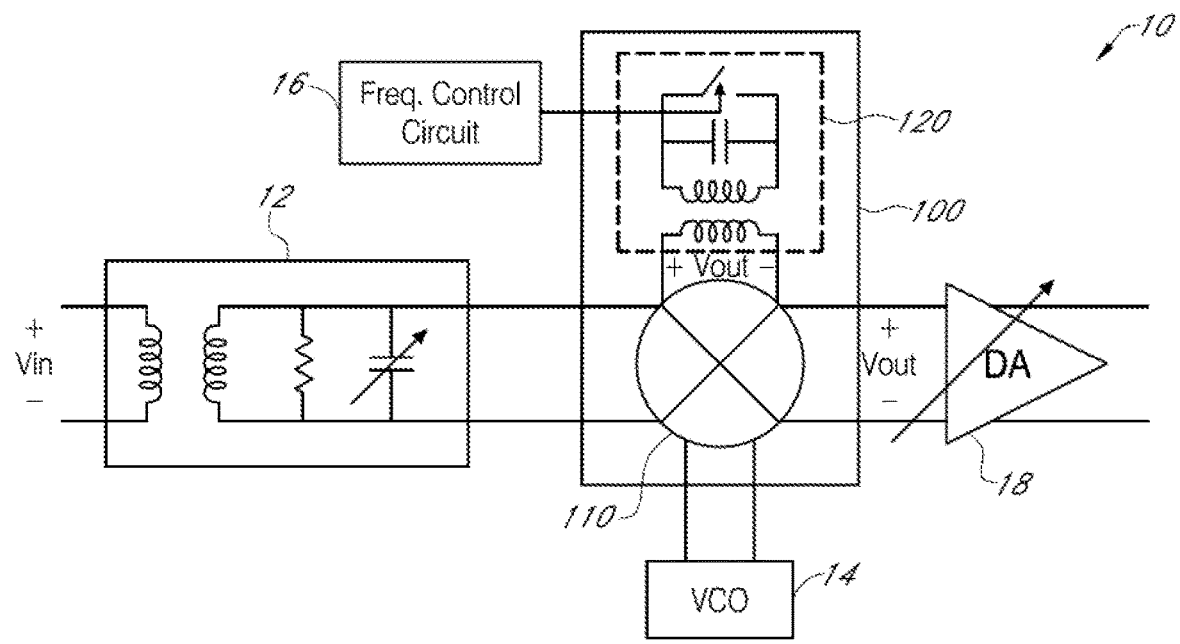
FIG. 1 illustrates a diagram of a portion of a transceiver including a mixer circuit, according to some example embodiments of the present disclosure.

FIG. 1 illustrates a diagram of a portion of a transceiver including a mixer circuit, according to some example embodiments of the present disclosure.

A transceiver 10 includes an input impedance matching circuit 12 for receiving an input voltage Vin from an input circuit; a local oscillator (e.g., a voltage-controlled oscillator (VCO)) 14 for generating a local oscillator (LO) signal at an LO frequency; a frequency band selector 16 for selecting the band of operation of the transceiver 10; a mixer circuit (e.g., a dual-band mixer circuit) 100 for tuning the frequency of operation of the transceiver 10 to operate in a first (RF) frequency band (e.g., a 28 GHz band) or in a second (RF) frequency band (e.g., a 39 GHz band) different from the first frequency band, based on a control signal CS (e.g., control bit) from the frequency band selector 16; and a differential amplifier 18 for amplifying the output of the mixer circuit 100 to a desired level. According to some embodiments, the mixer circuit utilizes a switchable inductance circuit that provides higher mixer gain and better mixer linearity than other mixer circuits of the related art. Furthermore, the mixer circuit 100 loads a secondary winding of a transformer (rather than the primary winding) to achieve a center frequency tuning.

According to some examples, the transceiver 10 may be part of a 5$^{th}$ generation (5G) millimeter wave (mmWave) new radio (NR) transmitter.

Figure 2:
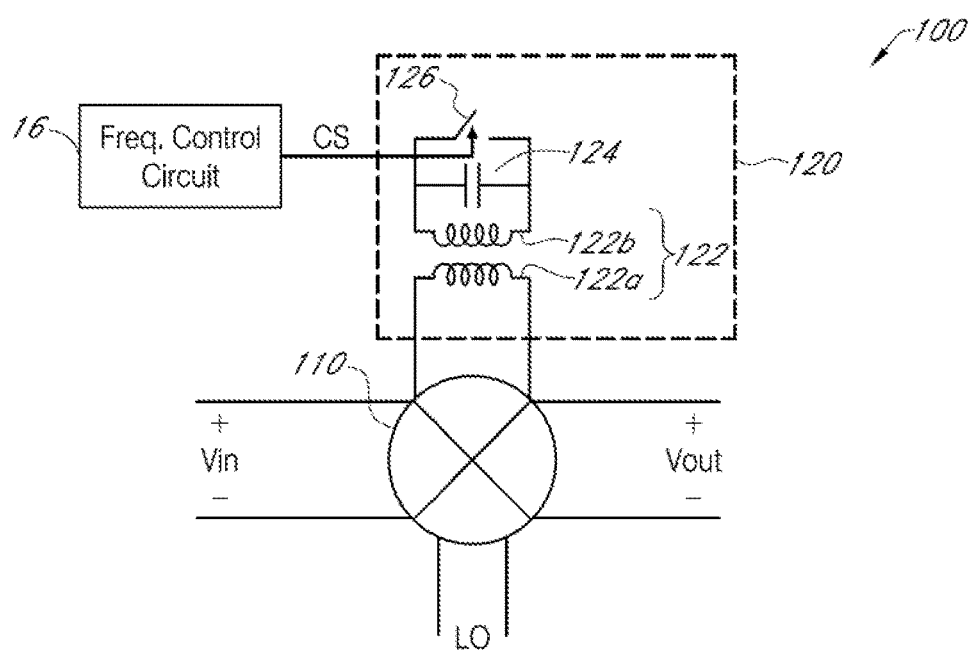
FIG. 2 illustrates a diagram of a dual-band mixer circuit utilizing a switchable inductance circuit, according to some example embodiments of the present disclosure.

FIG. 2 illustrates a diagram of a dual-band mixer circuit including a switchable inductance circuit, according to some example embodiments of the present disclosure.

The dual-band mixer circuit 100 includes a 3-port mixer 110 configured to convert an intermediate frequency (IF) at its input to radio frequency (RF) at its output by multiplying the IF with a local oscillator (LO) frequency to generate the RF as expressed in Equation (1):

$$F_{rf} = A\cos(w_{IF}t) \cdot B\cos(w_{LO}t) \sim A_1\cos((w_{IF} + w_{LO})t) + \quad \text{Equation (1)}$$
$$B_1\cos((w_{IF} - w_{LO})t)$$
$$= F_{IF+LO} + F_{IF-LO}$$

where $F_{rf}$ represents the desired output of the mixer circuit 100 at the RF, $w_{IF}$ and $w_{LO}$ respectively represent the angular frequencies IF and LO, A and B respectively represent amplitudes of the IF and LO signals at the input of the mixer circuit 100, and $A_1$ and $B_1$ respectively represent the amplitudes of the two tones at IF+LO frequency and IF-LO frequency. While Equation (1) expresses the conversion of IF to RF, a similar equation can illustrate the operation of the dual-band mixer circuit 100 in converting an RF signal at the input to an IF signal at the output.

According to some embodiments, the dual-band mixer circuit 100 includes a switchable inductance circuit 120 electrically coupled to the output of the 3-port mixer 110 via a primary inductor (e.g., primary winding/coil) 122*a* of a transformer 122. The 3-port mixer 110 may be a gilbert cell mixer; however, embodiments of the present disclosure are not limited thereto, and the 3-port mixer 110 may be any suitable mixer as recognized by a person of skill in the art. The 3-port mixer 110 experiences the switchable inductance circuit 120 as a load where the frequency response is being shaped. In some embodiments, the switchable inductance circuit 120 includes the transformer 122 with the primary inductor 122*a* coupled to the output of the 3-port mixer 110 and a secondary inductor 122*b* coupled to a capacitor 124 and a switch 126 in parallel configuration. As the primary and secondary inductors 122*a* and 122*b* of the transformer 122 are not electrically connected but are linked magnetically, the transformer 122 may electrically isolate the capacitor 124 from the output of the 3-port mixer 110 (and, e.g., break the direct electrical connection between the capacitor 124 and the 3-port mixer output).

In some examples, the transformer 122 may be a 1:1 transformer; however, embodiments of the present disclosure are not limited thereto, and any other suitable winding ratio, as recognized by a person of skill in the art, may be used. The capacitor 124 may be a metal-oxide-metal (MOM) capacitor or any other suitable capacitor as understood by a person of skill in the art. The switch 126 may be a metal-oxide-semiconductor field effect transistor (MOSFET) or any other suitable switch as understood by a person of skill in the art.

According to some embodiments, by appropriately toggling the switch 126, the mixer circuit 100 can switch the center frequency from a first/lower frequency (e.g., about 28 GHz) operation to a second/higher frequency (e.g., about 39 GHz) operation (or vice versa) and thus center the gain of the mixer at the desired frequency. For example, the center frequency of operation of the mixer circuit 100 may be switched to the lower frequency by deactivating/opening the switch 126, and may be switched to the higher frequency by activating/closing the switch 126 in the switchable inductance circuit 120. The switch 126 may be controlled by the control signal (e.g., control bit) CS received from the frequency band selector 16 for determining a desired center frequency.

According to some examples, the first and second bands may not overlap. For example, the lower RF frequency band may be centered at about 28 GHz, the higher RF frequency band may be centered at about 39 GHz, the IF may be 10 GHz and the LO frequency may be about 18 GHz, for the low band mode, or about 29 GHz, for the high band mode. The bandwidth of the bands is determined by the loaded quality factor of the network seen by the mixer. The frequency separation between the higher and lower frequency bands may range from sub-GHz up to about 12 GHz.

The center frequency of the mixer circuit 100 may be generally expressed by Equation (2):

$$F_c = \frac{1}{2 \cdot \pi \cdot \sqrt{L_p C_p}}$$

where $F_c$ represents the center frequency of the mixer circuit 100, and $L_p$ and $C_p$ respectively represent the effective inductance and capacitance at the primary side of the transformer 122.

To operate at the higher frequency band mode, the switch 126 is activated/closed, which effectively electrically shorts the capacitor 124 and forms a loop with the secondary inductor 122*b* (also referred to as an external coil). The induced current that flows on the secondary inductor 122*b* creates an opposite magnetic field that counters the magnetic field in the primary inductor 122*a* and thus lowers the total magnetic field in the primary inductor 122*a*, which reduces the effective inductance $L_p$, and thus tunes the center frequency $F_c$ to the higher band mode (this is described in more detail with reference to FIGS. 3A-3D). To operate at the lower frequency band mode, the switch 126 is deactivated/opened, which connects the secondary inductor 122*b* to the capacitor 126. The current that flows in the secondary inductor 122*b* resonates with the capacitor 124, which yields peaked impedance looking from the primary inductor 122*a* at the low frequency band, thus enabling the low-band mode operation.

Unlike the mixers of the related art, the topology of the mixing circuit 100 avoids using a switch and a capacitor on the primary inductance, which could limit linearity. Moreover, the gain achieved in this circuit is higher than a capacitor with a switch since the inductance at the low band mode is higher than would have been using a switch cap topology. According to some examples, the gain increase and linearilty improvement of the mixing circuit 100 over the related art may be about 2.5 dB and about 3 dB, respectively.

FIGS. 3A-3D illustrate a current/voltage flow process in the transformer 122 for switching a center frequency of the mixer circuit 100 to a higher frequency, according to some example embodiments of the present disclosure.

Figure 3A:
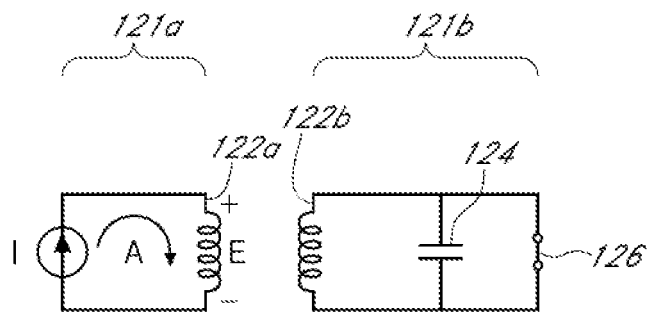
FIGS. 3A-3D illustrate a current/voltage flow process in a transformer of the switchable inductance circuit for switching a center frequency of the mixer circuit to a higher frequency, according to some example embodiments of the present disclosure.
Figure 3B:
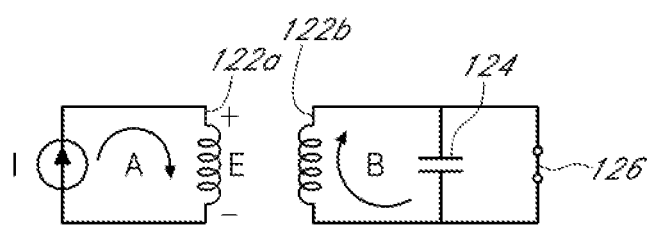
Figure 3C:
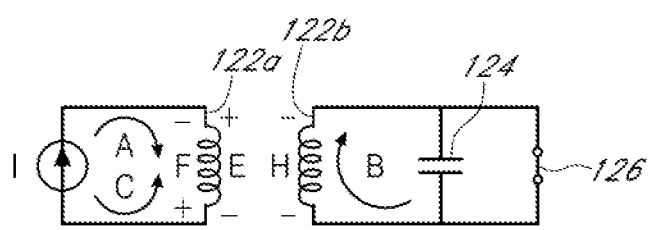
Figure 3D:
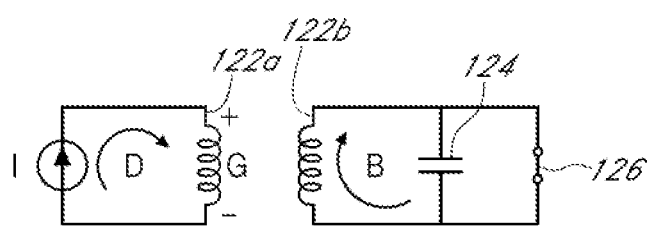

When the switch 126 is activated/closed, it creates an electrical short across the capacitor 124. As shown in FIG. 3A, when a voltage is applied at the primary side of the transformer 122, a current is created in the primary loop 121*a* (e.g., in the primary inductor 122*a*), as indicated by arrow A. As shown in FIG. 3B, the current flow in the primary inductor 122*a* creates a voltage (as shown by the voltage drop across region E) that couples to the secondary inductor 122*b*, which induces a current in the secondary loop 121*b* (e.g., in the secondary inductor 122*b*), as indicated by arrow B. As shown in FIG. 3C, the current in the secondary inductor 122*b* creates a voltage in the opposite direction (as shown by the voltage drop across region H) which couples to the primary loop (as indicated by arrow C) due to Faraday's law. As shown in FIG. 3D, the effective voltage in the primary loop is then reduced due to the coupled voltage (since the voltage F is subtracted from voltage E to produce a smaller voltage G), thus reducing the effective inductance $L_p$ at the primary side of the transformer 122.

As described with reference to FIGS. 2 and 3A-3D, having the capacitor 124 at the secondary side of the transformer 122 improves linearity since the switch 124, which inherently introduces non-linearity in any circuit, is not directly connected to (e.g., does not directly load) the output of the 3-port mixer, which generates the output (e.g., RF) signal. Further, the isolation of the capacitor 124 at the secondary side of the transformer 122 allows for the use of higher inductance at the primary side, which results in higher Quality (Q) factor and thus higher gain.

Figure 4:
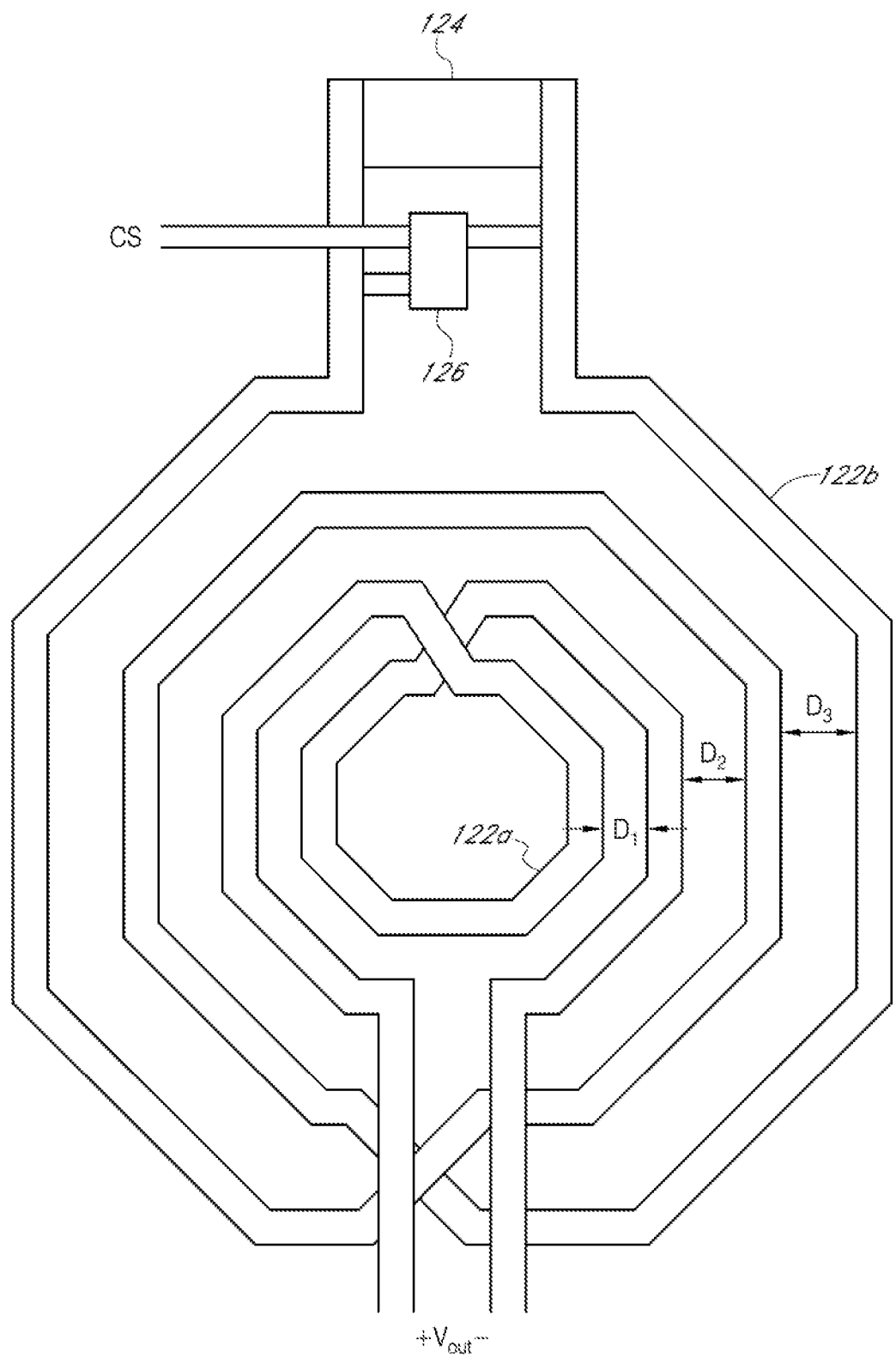
FIG. 4 illustrates an exemplary a physical layout of the switchable inductor circuit, according to some example embodiments of the present disclosure.

FIG. 4 illustrates an exemplary a physical layout of the switchable inductor circuit 120, according to some example embodiments of the present disclosure.

Referring to FIG. 4, according to some embodiments, the first inductor 122*a* includes first turns (e.g., first concentric turns) that are substantially or entirely at a first physical layer, and the the second inductor 122*b* includes second turns (e.g., second concentric turns) that are substantially or entirely at a second physical layer. In some examples, the first and second physical layers may be different layers, and the first and second inductors 122*a* and 122*b* may be mutually concentric (e.g., from a plan view) and stacked in parrallel; however, embodiments of the present invention are not limited thereto, and the first and second physical layers may be the same layer. The turns of each of the first and second turns may be arranged to conduct current in a common direction.

Adjacent ones of the first turns may be offset by a first distance (e.g., a first gap/separation) D1 along a radial direction of the first turns (e.g., in a plan view), and adjacent ones of the second turns may be offset by a third distance (e.g., a third gap/separation) D3 along a radial direction of the second turns (e.g., in a plan view). The first turns may be offset from the second turns by a second distance (e.g., a second gap/separation) D2 (e.g., in a plan view). For example, as shown in FIG. 4, the second turns may surround the first turns and an outermost turn of the first turns may be offset from an innermost turn of the second turns (e.g., along a radial direction of the first and second concentric turns from a plan perspective) by the second distance D2. However, embodiments of the present invention are not limited thereto, and the first turns may surround the second turns, in which case the second distance D2 may represent the separation between an outermost turn of the second turns and an innermost turn of the first turns.

According to some embodiments, the higher and lower frequencies, as well as the separation between the higher and lower frequencies, may be tuned (e.g., adjusted) by scaling the geometries of the primary and secondary inductors 122*a* and 122*b*. The desired frequency shift between the lower frequency and the higher frequency may be adjusted by changing the second and third distances D2 and D3. For example, increasing the second and third distances D2 and D3 may reduce the frequency separation between the higher frequency band and lower frequency band. Increasing the first distance D1 alone may affect both of the higher and lower frequency bands. To achieve a desired lower frequency band, the distances D1, D2, and D3 and the value of the capacitor 124 may be adjusted.

In FIG. 4, the primary and secondary inductors 122*a* and 122*b* are shown as being stacked in parallel at different physical layers of a chip; however, embodiments of the present disclosure are not limited thereto. For example, the primary and secondary inductors 122*a* and 122*b* may be positioned side-by side at the same layer.

As described above, the transceiver, according to embodiments of the present disclosure, includes a dual-band mixer circuit and supports dual frequency band RF operation. In some embodiments, the dual-band mixer circuit is capable of downconverting/upconverting a RF/IF frequency to IF/RF frequency by utilizing a switchable inductance circuit. A primary loop of a transformer in the switchable inductance circuit is electrically connected to a mixer, and a secondary loop of the transformer is electrically connected to a capacitor and a switch in parallel. The switch is opened to tune the mixer to switch to a lower center frequency, and the switch is closed to tune the mixer to switch to a higher center frequency.

Accordingly, this topology, according to some embodiments, avoids using a switch and a capacitor on the primary inductance (switch capacitor topology), which limits linearity. Moreover, the gain achieved by this circuit is higher than a switch capacitor topology as the inductance at the low frequency band mode is higher than would have been using a switch cap topology. Furthermore, the dual-band mixer circuit according to some embodiments eliminates the need to rely on a broadband mixer to cover the higher and lower frequency bands. Relative to the dual-band mixer circuit of the present disclosure, a broadband mixer covers unnecessary frequency bands, has lower gain, has a larger area, and is more sensitive to process variation.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include", "including", "comprises", and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Further, the use of "may" when describing embodiments of the inventive concept refers to "one or more embodiments of the inventive concept". Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the terms "use", "using", and "used" may be considered synonymous with the terms "utilize", "utilizing", and "utilized", respectively.

The transceiver and/or any other relevant devices or components according to embodiments of the present disclosure described herein may be implemented by utilizing any suitable hardware, firmware (e.g., an application-specific integrated circuit), software, or a suitable combination of software, firmware, and hardware. For example, the various components of the independent multi-source display device may be formed on one integrated circuit (IC) chip or on separate IC chips. Further, the various components of the transceiver may be implemented on a flexible printed circuit film, a tape carrier package (TCP), a printed circuit board (PCB), or formed on the same substrate. Further, the various components of the transceiver may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer-readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present disclosure.

While this disclosure has been described in detail with particular references to illustrative embodiments thereof, the embodiments described herein are not intended to be exhaustive or to limit the scope of the disclosure to the exact forms disclosed. Persons skilled in the art and technology to which this disclosure pertains will appreciate that alterations and changes in the described structures and methods of assembly and operation can be practiced without meaningfully departing from the principles, and scope of this disclosure, as set forth in the following claims and equivalents thereof.

What is claimed is:

1. A dual-band mixer circuit comprising:
   a mixer configured to receive an input signal and a local oscillator (LO) signal and to generate an output frequency signal; and
   a switchable inductance circuit coupled to an output of the mixer, and comprising:
      a transformer comprising a primary inductor and a secondary inductor, the primary inductor being electrically coupled to the output of the mixer and the secondary inductor being electrically isolated from the output of the mixer;
      a capacitor electrically coupled to the secondary inductor; and
      a switch directly coupled in parallel with the capacitor and the secondary inductor.

2. The dual-band mixer circuit of claim 1, wherein the mixer is configured to generate the output frequency signal within a first frequency band or a second frequency band, and
   wherein the first frequency band does not overlap with the second frequency band.

3. The dual-band mixer circuit of claim 1, wherein the input signal is an intermediate frequency signal, and the output frequency signal is a radio frequency signal.

4. The dual-band mixer circuit of claim 1, wherein the input signal is a radio frequency signal, and the output frequency signal is an intermediate frequency signal.

5. The dual-band mixer circuit of claim 1, wherein the mixer is configured to generate the output frequency signal within a first frequency band or a second frequency band,
   wherein the switch is configured to activate or deactivate based on a control signal, and
   wherein the mixer is configured to generate the output frequency signal at the second frequency band in response to the switch being activated, and to generate the output frequency signal at the first frequency band in response to the switch being deactivated.

6. The dual-band mixer circuit of claim 5, wherein the first and second frequency bands are centered at 28 GHz and 39 GHz, respectively.

7. The dual-band mixer circuit of claim 1, wherein the mixer is configured to generate the output frequency signal within a first frequency band or a second frequency band,
   wherein the primary inductor and the secondary inductor comprise first turns and second turns, the first and second turns being mutually concentric, and
   wherein the primary and secondary inductors are stacked in parallel at different physical layers.

8. The dual-band mixer circuit of claim 7, wherein a center of the first frequency band is based on a first distance between adjacent ones of the first turns, a second distance between innermost turn of the second turns and an outermost turn of the first turns, a third distance between adjacent ones of the second turns, a capacitance value of the capacitor, and
   wherein a frequency separation between the first and second frequency bands is based on the second and third distances.

9. The dual-band mixer circuit of claim 1, wherein the transformer is a 1:1 transformer,
   wherein the capacitor is a metal-oxide-metal (MOM) capacitor, and
   wherein the switch is a metal-oxide-semiconductor field effect transistor (MOSFET).

10. The dual-band mixer circuit of claim 1, wherein the mixer is a gilbert cell mixer.

11. A transceiver comprising:
    a frequency band selector configured to generate a control signal;
    a mixer configured to receive an input signal and a local oscillator (LO) signal and to generate an output frequency signal; and
    a switchable inductance circuit electrically coupled to an output of the mixer, and comprising:
       a transformer comprising a primary inductor and a secondary inductor, the primary inductor being electrically coupled to the output of the mixer and the secondary inductor being electrically isolated from the output of the mixer;
       a capacitor electrically coupled to the secondary inductor; and
       a switch directly coupled in parallel with the capacitor and the to secondary inductor, the switch being configured to activate or deactivate based on the control signal.

12. The transceiver of claim 11, further comprising a local oscillator configured to generate the LO signal at an LO frequency.

13. The transceiver of claim 11, wherein the mixer is configured to generate the output frequency signal within a first frequency band or a second frequency band, and
    wherein the first frequency band does not overlap with the second frequency band.

14. The transceiver of claim 11, wherein the mixer is configured to generate the output frequency signal within a first frequency band or a second frequency band,
    wherein the switch is configured to activate or deactivate based on a control signal, and
    wherein the mixer is configured to generate the output frequency signal at the second frequency band in response to the switch being activated, and to generate the output frequency signal at the first frequency band in response to the switch being deactivated.

15. The transceiver of claim 14, wherein the first and second frequency band are centered at 28 GHz and 39 GHz, respectively.

16. The transceiver of claim 11, wherein the input signal is an intermediate frequency signal, and the output frequency signal is a radio frequency signal.

17. A method of operating a dual-band mixer circuit comprising:
   activating, by a frequency band selector, a switch of the dual-band mixer circuit to operate at a first frequency band; and
   deactivating, by the frequency band selector, the switch of the dual-band mixer circuit to operate at a second frequency band,
   the dual-band mixer circuit comprising:
      a mixer configured to receive an input signal and a local oscillator (LO) signal and to generate an output frequency signal within the first frequency band or the second frequency band; and
      a switchable inductance circuit electrically coupled to an output of the mixer, and comprising:
         a transformer comprising a primary inductor and a secondary inductor, the primary inductor being electrically coupled to the output of the mixer and the secondary inductor being electrically isolated from the output of the mixer;
         a capacitor electrically coupled to the secondary inductor; and
         the switch that is directly coupled in parallel with the capacitor and the secondary inductor, the switch being configured to activate or deactivate based on a control signal from the frequency band selector.

* * * * *